US007057931B2

(12) United States Patent
Lutze et al.

(10) Patent No.: US 7,057,931 B2
(45) Date of Patent: Jun. 6, 2006

(54) FLASH MEMORY PROGRAMMING USING GATE INDUCED JUNCTION LEAKAGE CURRENT

(75) Inventors: Jeffrey W. Lutze, San Jose, CA (US); Chan-Sui Pang, Sunnyvale, CA (US)

(73) Assignee: Sandisk Corporation, Sunnyvale, CA (US)

(*) Notice: Subject to any disclaimer, the term of this patent is extended or adjusted under 35 U.S.C. 154(b) by 3 days.

(21) Appl. No.: 10/703,717

(22) Filed: Nov. 7, 2003

(65) Prior Publication Data

US 2005/0099849 A1 May 12, 2005

(51) Int. Cl.
*G11C 16/10* (2006.01)

(52) U.S. Cl. .......................... 365/185.18; 365/185.14; 365/185.15

(58) Field of Classification Search ........... 365/185.03, 365/185.14, 185.15, 185.18
See application file for complete search history.

(56) References Cited

U.S. PATENT DOCUMENTS 4,409,723 A * 10/1983 Harari ........................ 438/257
5,402,371 A * 3/1995 Ono ...................... 365/185.07
5,408,115 A * 4/1995 Chang ........................ 257/324
5,455,792 A * 10/1995 Yi ......................... 365/185.15
5,467,306 A 11/1995 Kaya et al.
5,523,969 A 6/1996 Okazawa et al.
5,677,873 A 10/1997 Choi et al.
5,719,888 A 2/1998 Tanzawa et al.
5,793,079 A 8/1998 Georgescu et al.
5,867,426 A * 2/1999 Ahn et al. ............. 365/185.18
5,867,429 A 2/1999 Chen et al.
5,986,929 A 11/1999 Sugiura et al.
5,991,202 A 11/1999 Derhacobian et al.
6,002,152 A 12/1999 Guterman et al.
6,061,270 A 5/2000 Choi
6,091,634 A 7/2000 Wong et al.
6,151,248 A 11/2000 Harari et al.

(Continued)

OTHER PUBLICATIONS

Kurata, Constant-Charge-Injection Programming for 10-MB/s Multilevel AG-AND Flash Memories, 2002 Symposium on VLSI Circuits Digest of Technical Papers, pp. 302-303.

(Continued)

*Primary Examiner*—Richard Elms
*Assistant Examiner*—J. H. Hur
(74) *Attorney, Agent, or Firm*—Vierra Magen Marcus & DeNiro LLP

(57) ABSTRACT

A method for programming a storage element and a storage element programmed using gate induced junction leakage current are provided. The element may include at least a floating gate on a substrate, an active region in the substrate, and a second gate adjacent to the floating gate. The method may include the steps of: creating an inversion region in the substrate below the floating gate by biasing the first gate; and creating a critical electric field adjacent to the second gate. Creating a critical electric field may comprise applying a first positive bias to the active region; and applying a bias less than the first positive bias to the second gate. The element further includes a first bias greater than zero volts applied to the active region and a second bias greater than the first bias applied to the floating gate and a third bias less than or equal to zero applied to the second gate. The first and third bias are selected to create leakage current in the substrate between the floating gate and the select gate.

60 Claims, 9 Drawing Sheets

U.S. PATENT DOCUMENTS

| | | | | |
|---|---|---|---|---|
| 6,266,270 | B1 | 7/2001 | Nobukata | |
| 6,456,528 | B1 | 9/2002 | Chen | |
| 6,462,988 | B1 | 10/2002 | Harari | |
| 6,469,933 | B1 | 10/2002 | Choi et al. | |
| 6,529,412 | B1 | 3/2003 | Chen et al. | |
| 6,697,280 | B1 * | 2/2004 | Natori | 365/185.05 |
| 2002/0051384 | A1 | 5/2002 | Cemea et al. | |
| 2002/0118574 | A1 | 8/2002 | Gongwer et al. | |
| 2003/0080370 | A1 | 5/2003 | Harai et al. | |
| 2003/0147278 | A1 | 8/2003 | Tanaka et al. | |
| 2004/0130947 | A1 | 7/2004 | Fan Der-Tsyr et al. | |

OTHER PUBLICATIONS

Telya, NAND Memory Device Interface to the TMS320VC55x Application Note, 2002 SanDisk Corporation pp. 1-22.

DiMaria, et al., “Electrically-Alterable Read-Only-Memory Using Si-rich SiO.sub.2 Injectors and a Floating Polycrystalline Silicon Storage Layer”, J. Appl. Phys., vol. 52, Issue 7, Jul. 1981, pp. 4825-4842, New York.

Hori et al., “A MOSFET with Si-Implanted Gate-SiO.sub.2 Insulator for Nonvolatile Memory Applications”, IEDM 92, Dec. 1992, pp. 469-472, San Francisco.

* cited by examiner

Vfg = 6v 1.0 E-09
1.0 E-10
1.0 E-11
1.0 E-12
1.0 E-13
1.0 E-14
1.0 E-15
$I_{drain}$ (A/um)
64
62
60
0.5
1.5
2.5
3.5
4.5
5.5
6.5
7.5
0
1
2
3
4
5
6
7
$V_{drain}$ (V)

Vcg = 11v Vb =0V 6
5
4
3
2
1
0
-1
-2
Cell Threshold (v)
68
79
1E-05
1E-04
1E-03
1E-02
1E-01
1E+00
1E+01
Programming Time (Sec)

150
102
104
106
100CG
102CG
106CG
108CG
125a
100FG
125b
102FG
125c
106FG
125d
108FG
120
104SG
130
110SG

100CG
120
102CG
106CG
130
108CG
150
A
A
Y
X
104SG
110SG

400SG
400CG
412
410CG
422
420CG
405
440
410
420
430
400

400CG
410
410CG
420
420CG
430
400SG
A
A
410SG
420SG
Y
X

FLASH MEMORY PROGRAMMING USING GATE INDUCED JUNCTION LEAKAGE CURRENT

BACKGROUND OF THE INVENTION

1. Field of the Invention

The present invention is directed to programming techniques for a storage element, and in particular, to programming non-volatile semiconductor memory devices.

2. Description of the Related Art

Non-volatile semiconductor memory is popular for a number of uses, including cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memory types.

Both EEPROM and flash memory utilize arrays of storage elements to store one or more bits of data per element. Each element generally includes a floating gate that is positioned above and insulated from a channel region and a semiconductor substrate. The floating gate is positioned between source and drain regions. A control gate may be provided over and insulated from a floating gate. The threshold voltage of each memory transistor is controlled by the amount of charge that has remained on the floating gate. That is, the minimum amount of voltage that must be applied to the control gate before a transistor is turned on to permit conduction between its source and drain is controlled by the level of charge on the floating gate. Many EEPROMs and flash memories have a floating gate that is used to store two ranges of charges and, therefore, the memory cell can be programmed/erased between two states. Such memory cells store one bit of data. Other EEPROMs and flash memory cells store multiple ranges of charge and, therefore, such memory cells can be programmed to store multiple states. Such memory cells store multiple bits of data.

The process of applying electrons or holes to a floating gate in order to program or erase a storage element has been performed by a number of different physical mechanisms. Some mechanisms which have generally shown to be viable alternatives include Fowler-Nordheim (F-N) tunneling through thin oxides, channel hot-electron (CHE) injection, and source side injection (SSI). Fowler-Nordheim tunneling is a field-assisted electron tunneling mechanism based on quantum mechanical tunneling of electrons through an oxide layer and onto a floating gate. Hot carrier and source side injection are based on the injection of energetic carriers by a large electric field injected over the energy barrier of the oxide between the substrate and the floating gate.

Fowler-Nordheim tunneling normally requires fields on the order of 10 MV/CM across the silicon/$SiO_2$ energy barrier so that electrons can tunnel from the silicon across the $SiO_2$ into the floating gate.

Hot carrier injection used large drain biases to create "hot" electrons. At such large drain biases, carriers that flow in the channel of a MOS transistor are heated by the large electric fields in the channel and their energy distribution is shifted higher. Through impact-ionization in the channel regions carriers gain enough energy to allow them to surmount the barrier between the substrate and floating gate. One disadvantage of channel hot electron injection is its high-power consumption. As a result, thin oxides have been used to achieve large injection fields at moderate voltages.

Source side injection (SSI) has been proposed as a lower power alternative to hot carrier injection. In this process, the channel between the source and drain regions is split into two areas controlled by different gates. On one side of the channel (the source side), a gate is biased at a condition for maximum hot-electron generation (e.g. close to the threshold voltage of the channel). At the other side of the channel (the drain side), the gate is biased to a potential that is equal to or higher than the drain voltage in order to establish a vertical field that is favorable to hot electron injection to the floating gate. As a result, the drain potential is extended toward the region between the gates by an inversion layer. The inversion layer is created under the floating gate and, in some cases, the source side gate. An effective transistor channel between source region and the inversion region is created by the area under the source side gate. Electrons are accelerated from the source made "hot" electrons in a peaked lateral field between the effective channel and the inversion region.

Hence, a mechanism which allows the use of low power and low current programming of a non-volatile memory device is generally desirable.

SUMMARY OF THE INVENTION

The present invention, roughly described, pertains to a method for programming a storage element using gate induced junction leakage current. The element may include at least a first gate on a substrate, an active region in the substrate, and a second gate adjacent to the first gate. In this aspect, the method may include the steps of: creating an inversion region in the substrate below the first gate by biasing the first gate; and creating a critical electric field adjacent to the second gate sufficient to create electron-hole pairs at a junction with the inversion region.

Additionally, the step of creating a critical electric field adjacent to the second gate may comprise applying a first positive bias to the active region; and applying a bias less than the first positive bias to the second gate.

In a further aspect, the step of applying a bias less than the first positive bias may include applying a bias equal to or less than zero volts; and the step of applying a first positive bias may include applying a bias greater than three volts.

In a further aspect, the invention may comprise a storage element including an active region having a first impurity type in a substrate having substantially a second impurity type. The element includes a floating gate on the substrate, and a select gate positioned adjacent to the floating gate on the substrate. The element further includes a first bias greater than three volts applied to the active region, a second bias greater than the first bias applied to the floating gate, and a third bias less than or equal to zero applied to the select gate, said first and second bias selected to create leakage current in the substrate between the floating gate and the select gate.

In another aspect, the first positive bias may be greater than 3 volts and the second bias may be greater than 8 volts.

In a further aspect, the bias on the active region is larger than the bias on the first gate, creating a depletion region in the substrate below the first gate.

In yet another aspect, the invention comprises a method of programming at least a storage element provided on a substrate, said element including at least a floating gate, a select gate positioned laterally adjacent to the floating gate, and an active region. The method may include the steps of applying a first positive bias to the active region; applying a second bias less than or equal to zero to the select gate; and applying a third bias greater than the first bias to the floating gate.

In a further aspect, the step of applying a second bias includes applying a bias in a range of zero to negative three volts; the step of applying a first positive bias includes applying a bias greater than 3 volts; and the step of applying a third bias includes applying a bias equal to or greater than 8 volts.

In another embodiment, the invention comprises an apparatus. The apparatus includes a storage element, the element including at least a first gate on a substrate, an active region in the substrate, and a second gate adjacent to the first gate. A means creating an inversion region in the substrate below the first gate by biasing the first gate and means for creating a critical electric field adjacent to the second gate are also provided.

In a still further embodiment, the invention is a storage element. The element includes an active region having a first impurity type in a substrate having substantially a second impurity type, a charge storing dielectric; and a select gate positioned adjacent to the floating gate on the substrate. In the storage element, a first bias greater than zero volts is applied to the active region, a second bias greater than the first bias applied to the floating gate, and a third bias less than or equal to zero applied to the select gate. Said first and third bias are selected to create leakage current in the substrate between the floating gate and the select gate

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

Figure 1:
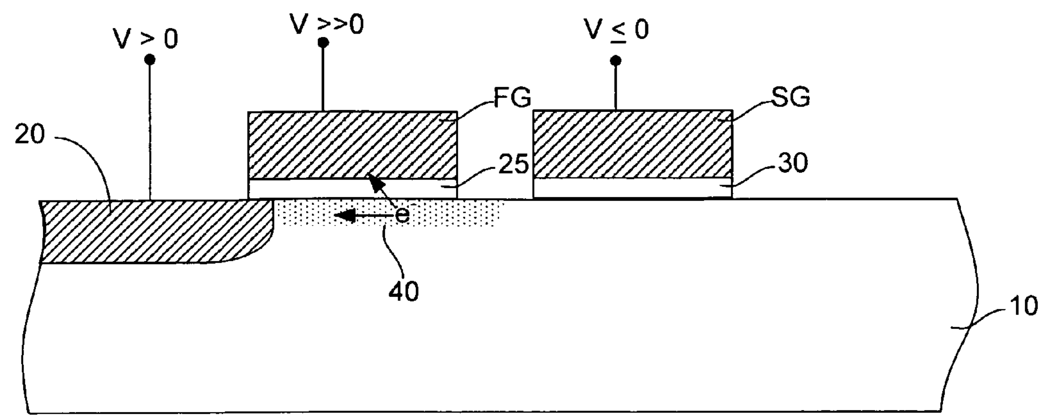
FIG. 1 depicts a simplified cross-section of a memory structure illustrating the method for programming a memory structure in accordance with the present invention.

FIG. 1 is a cross-sectional diagram of an idealized non-volatile memory cell illustrating the principles of the present invention. It should be recognized that FIG. 1 shows a simplified representation of a basic cell, and omits certain details in order to more clearly present the invention. For example, the substrate and gate elements are illustrated with little detail of dielectrics and connection layers that exist in a practical implementation of the cell. However, it will be understood that appropriate dielectric and connection layers are to be included in a practical implementation of the structure.

Shown in FIG. 1 is a substrate 10 having a background doping concentration of, for example, a first impurity type, such as a p-type impurity. It should be understood that substrate 10 may represent a bulk substrate, or may represent an impurity well formed in a bulk substrate. It should also be understood that while the invention will be generally described with respect to a device formed in a p-type substrate or a p-well, the impurity concentration types discussed herein may be reversed such that those regions discussed as being p-type may be n-type and vice-versa.

In one embodiment, the impurity concentration of the substrate 10 or well will be on the order of $10^{16}$ atm/cm$^3$ to $10^{18}$ atm/cm$^3$ of, for example, boron. An active region 20 is provided in substrate 10 and may comprise a second impurity type, such as an n-type impurity region doped with arsenic or phosphorous having a concentration of the impurity in a range of about $10^{18}$ to $10^{20}$ atm/cm$^3$. A floating gate FG is provided on the surface of substrate 10. The floating gate FG is separated from substrate 10 by a floating gate oxide 25. Also provided is a select gate SG separated from substrate 10 by a select gate oxide 30.

The gates in the foregoing structure are preferably made of deposited polysilicon material, although other suitable electrically conductive materials may be used in place of one or more of the polysilicon layers described above.

Also shown in FIG. 1 are general bias conditions necessary for programming the memory structure shown in FIG. 1. The bias conditions include a voltage greater than zero applied to the active region 20, a voltage less than or equal to zero applied to select-gate SG, and a voltage greater than that applied to the active region applied to the floating gate FG. All of the voltages are with respect to zero volts applied to the substrate. Under these bias conditions, an inversion region 40 is formed beneath floating gate FG. The inversion region 40 is at the same potential as the active region 20, and hence a "virtual" junction is formed which extends to a region in the substrate adjacent to the select gate SG. In general, the n-type region 20 is biased positive in relation to the p-type region to reverse bias the p-n junction. The select gate region is then at a low voltage or even a negative voltage in order to increase the reverse bias field. When the field from the select gates to the inversion region is large enough, gate induced junction leakage current will be initiated at this virtual junction. This bias condition results in a flow of electrons (represented by "e−" in the figures) in the direction towards active region 20. Generally, electrons will be attracted to the active region 20; however, if a voltage much greater than zero is applied to the floating gate FG, some percentage of the electrons in the inversion region 40 will be attracted onto the floating gate FG.

Bias conditions illustrated in FIG. 1 generally enhance the well known condition known as gate induced junction leakage current. This condition occurs when a high field from a nearby gate can cause a reverse bias junction to leak at a point near the gate. This method is distinguished from SSI in that electron generation is not provided by a high lateral field acceleration of source carriers between a source-side active region and a drain-side active region, but rather by leakage from the select gate SG operating at a bias condition creating a critical field between the substrate and the inversion region. Electron generation in the present invention is provided by the electron-hole pair generation created by the critical electric field. The structure shown in FIG. 1 was utilized in generating the simulation measurements providing the data exemplified in the graphs shown in FIGS. 3–4.

Figure 2:
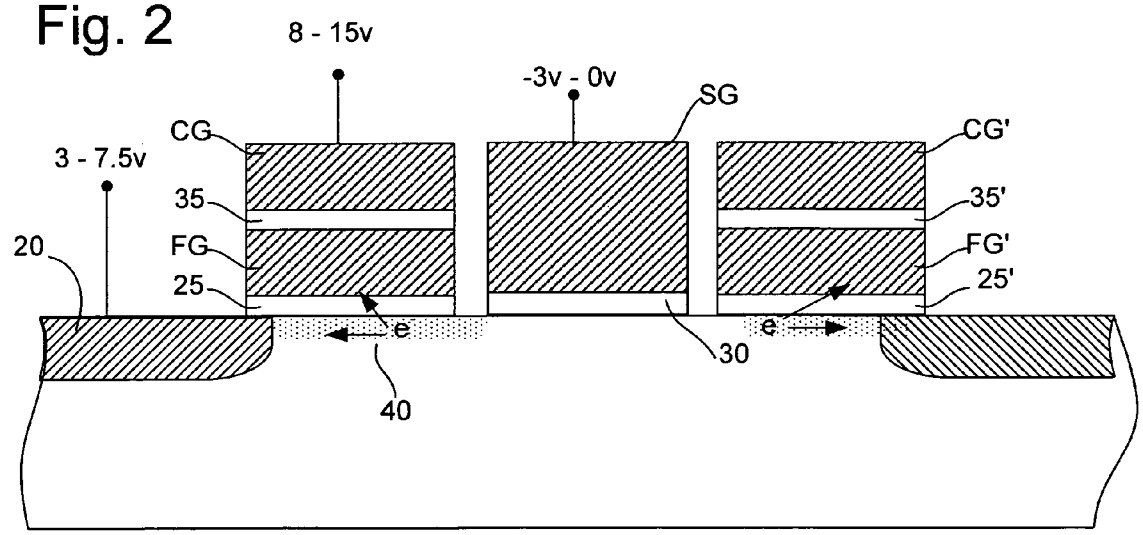
FIG. 2 is a second simplified cross-section of a memory structure illustrating the method for the present invention.

FIG. 2 illustrates a cross-section of one embodiment of a memory structure using a control gate CG isolated from a floating gate FG by a control gate oxide 35. Also shown in FIG. 2 is a second memory structure using the common select gate SG, second floating gate FG', second control gate CG' and active region 20'. Exemplary bias conditions are shown as applied generally to each of the active region 20, control gate CG and select gate SG. Each of the two storage elements represented in FIG. 2 may be programmed separately. To program the element of floating gate FG, under the exemplary conditions shown in FIG. 2, a bias of 3 v–7.5 v is applied to active region 20, a bias of 8–15 v is applied to control gate CG, and a bias in the range of a negative 3 to 0 v is applied to select gate SG.

Figure 3:
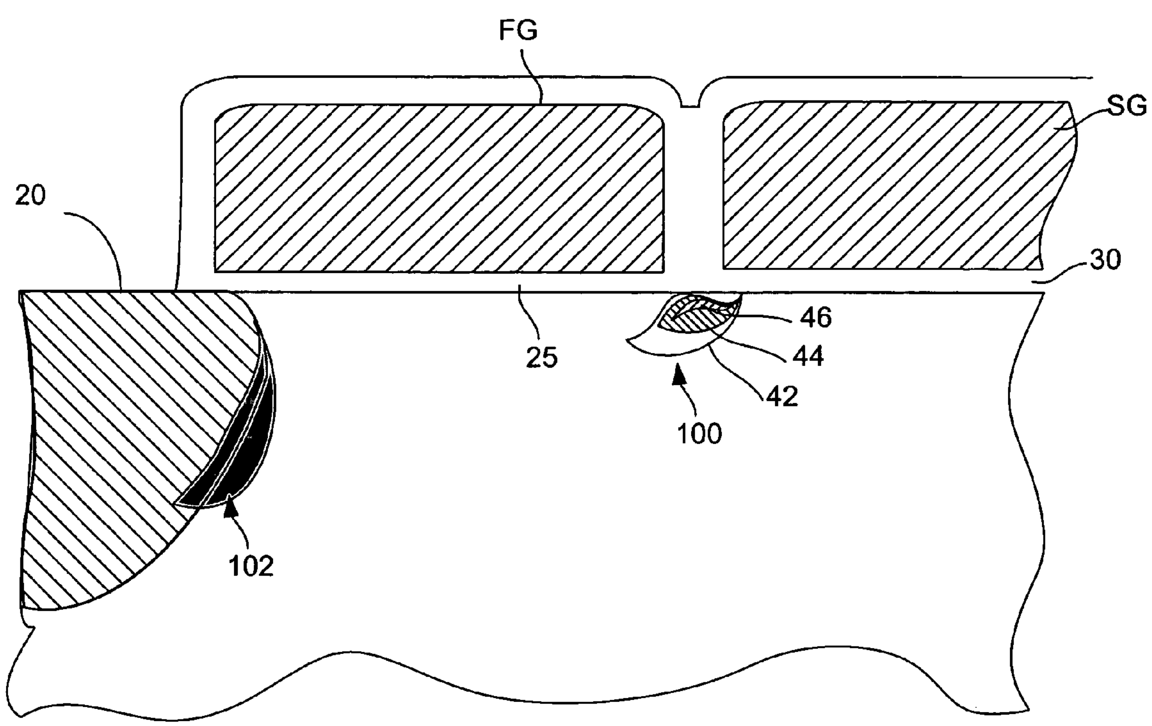
FIG. 3 is a depiction of a cross-section of a device such as that shown in FIG. 1 generated by a device simulation tool showing regions where electron hole generation occurs adjacent to the select gate in accordance with the present invention.

FIG. 3 is a simulation provided by a Taurus-Medici device simulation tool manufactured by Synopsis, Inc. illustrating a portion of a cross-section of a device similar to that shown in FIG. 1. In this simulation, the drain potential was set at 7.5 v, the floating gate potential at 6v and the select gate at –3v. These conditions illustrate two regions 100, 102 where electron-hole generation is occurring. In the figure, in region 100, regions 42, 44, and 46 illustrate regions of logarithmically increasing numbers of pairs generated in each region. Region 102 has a similar hole generation rate as region 42. As illustrated in this simulation, the majority of carriers are created in the region where a high field is found between an inversion layer and a select gate. The inversion layer is not shown in FIG. 3. Hence, in contrast to SSI, electron-hole pair generation occurs at the region between the FG and SG, thereby providing the source of programming current, rather than from a source side active region.

Figure 4:
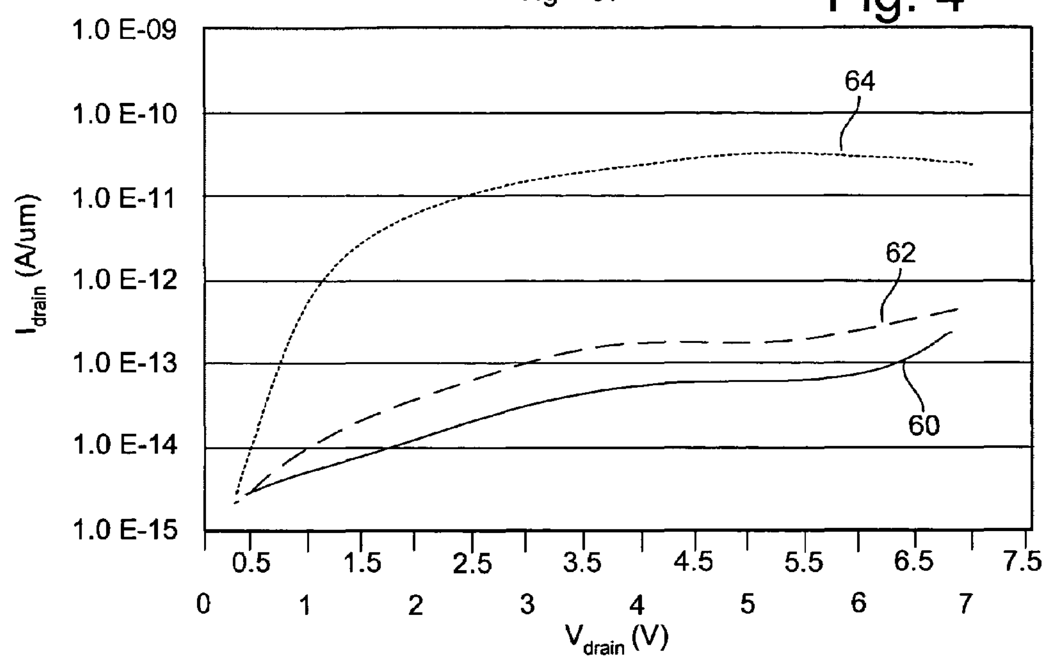
FIG. 4 is a graph showing a series of plots representing drain current vs. drain voltage in a simulated device, such as that shown in FIG. 1, over a series of select gate voltages when utilizing the method in accordance with the present invention.

FIG. 4 shows the plot of the drain current ($I_{drain}$) versus the drain voltage ($V_{drain}$) for a series of select gate voltages ($V_{sg}$) and a fixed floating gate voltage. Plot 60 is for a $V_{sg}$ of 3 v; plot 62 is for a $V_{sg}$ of 0 v, and plot 64 of for a $V_{sg}$ of negative 3 v. As shown therein, the drain current substantially increases as the select gate bias becomes more negative. Hence, control of the select gate bias can increase the speed of this programming technique.

Figure 5:
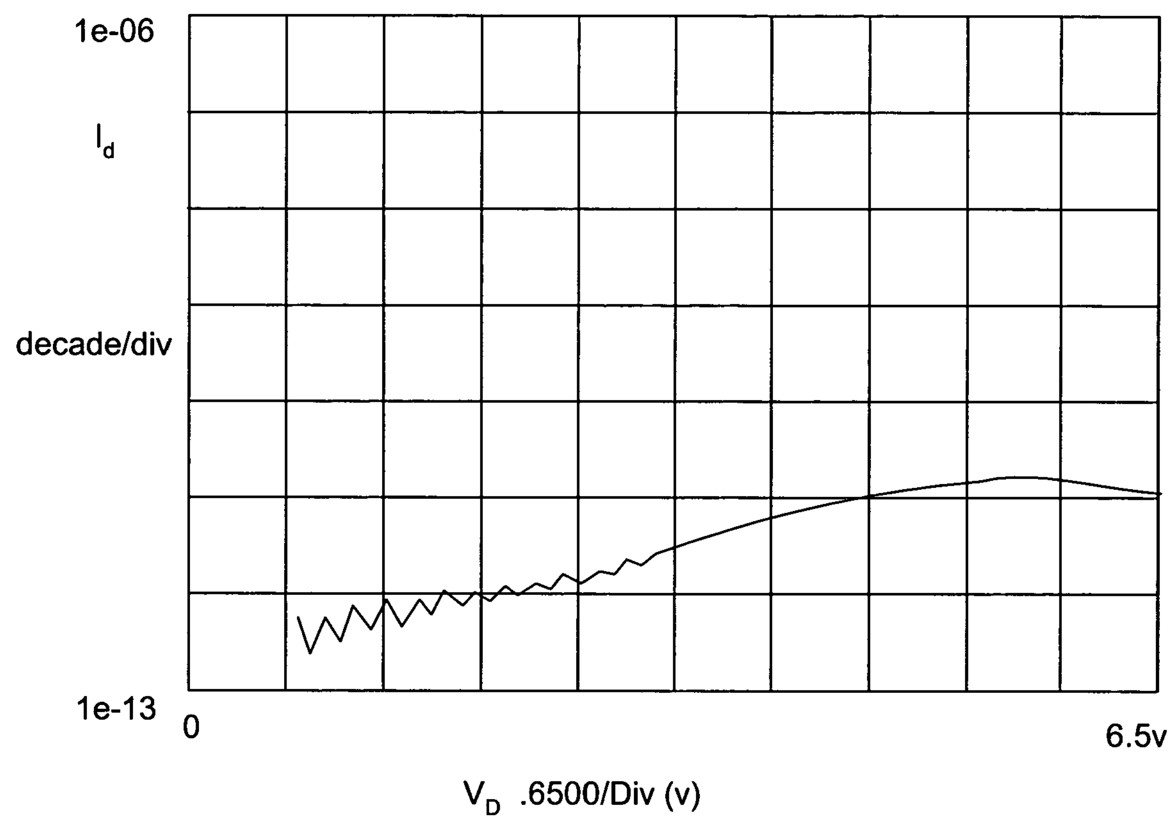
FIG. 5 is a graph illustrating a current/voltage sweep at the drain of a storage element, such as that shown in FIG. 2, for a change in the voltage applied to the active region in accordance with the method of the present invention.

FIG. 5 is an I-V sweep of the drain current versus drain voltage where a cell such as that shown in FIG. 2 is biased with a control gate voltage of 11 v, and a select gate of $V_{sg}$ of 0 v. As shown therein, drain current occurs even at low drain voltage levels and, for these bias conditions, peaks at approximately 5.3 v. The I-V curve peaks because the floating gate has become programmed with electrons.

Figure 6:
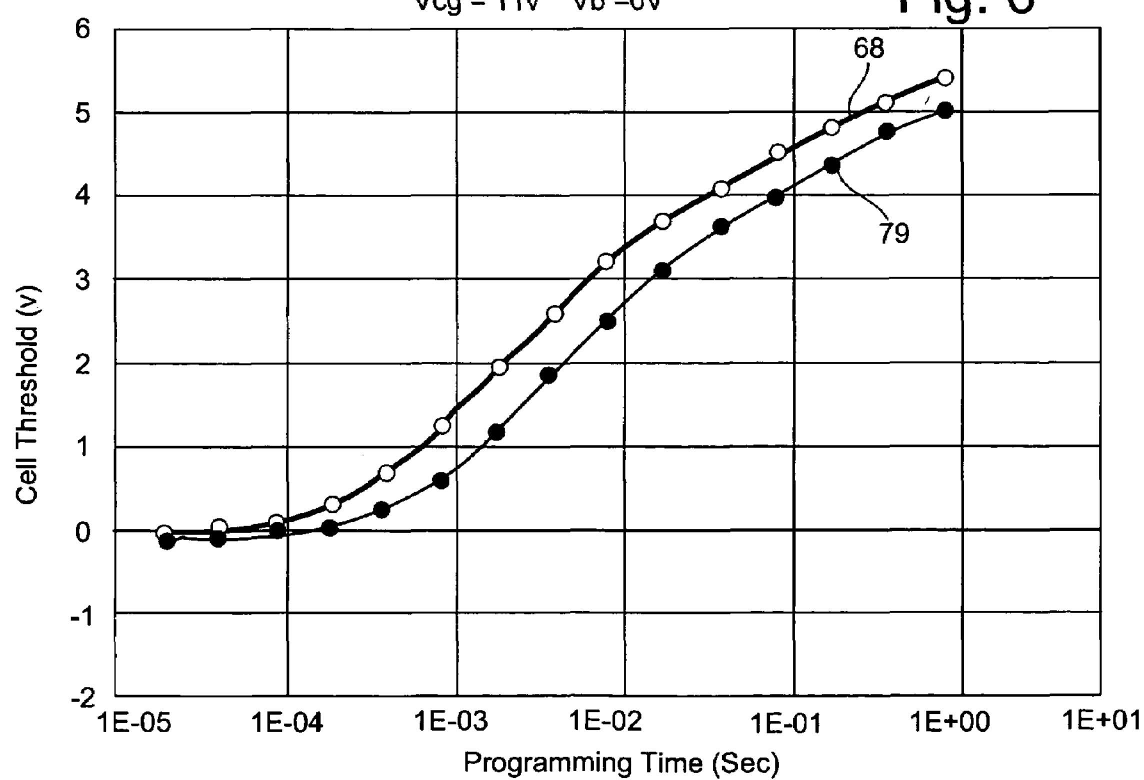
FIG. 6 is a plot showing the effect of varying the select gate voltages for a given set of bias conditions on programming time in accordance with the method of the present invention.

FIG. 6 illustrates two plots of programming times for a drain bias of 6.5 v, a control gate bias of 11 v, and select gate voltages of (–)2 v (at line 68) and 0 v at line 79. As shown therein, the more negative the voltage at the select gate, the quicker the increase in the cell threshold voltage.

Using the parameters of bias control over the floating gate (via the control gate), the select gate, and the drain, the programming method of the present invention may be optimized.

Other factors may also be varied in order to optimize the method of the present invention. For example, the doping concentrations of substrate 10 and the active region 20 influence the bias current generation in the structure. In this respect, doping concentrations of the region 20 for an n-type region may be on the order of $10^{17}$–$10^{20}$ atms/cm$^3$ of an n-type impurity such as arsenic or phosphorous. Doping concentrations for the substrate 10 are a region implanted below floating gate FG and select gate SG and may be on the order of $10^{16}$–$10^{18}$ atm/cm$^3$ of an impurity such as boron. Greater doping concentrations of the p-type region will increase electron-hole pair generation, and hence the gate induced current in region 100. Another factor includes variance in the thickness of the select gate oxide 30 and floating gate oxide 25. Oxide thicknesses for the floating gate oxide 25 will generally be controlled by data retention characteristics for a given cell. In one embodiment, oxide thicknesses for floating gate oxide 25 may be in the range of approximately 80 to 90 angstroms, but may be thicker or thinner, depending on the application. Select gate oxide 30 may have a thickness different from that of the floating gate oxide, which may be in the range of about 20 angstroms to 200 angstroms. Thinner oxides at the select gate will increase the field strength in the substrate, again increasing pair generation. Voltage conditions may be applied in the following range: for the select gate SG, voltage may be in the range of 0 v to (–)3 v; for the control gate CG, voltage may be in the range of 7 v to 15 v; and for active region 20, voltage may be in the range of 3 v–7.5 v.

While it should be recognized that the programming technique of the present invention may be utilized in any number of types of array structures, three exemplary cell structures are shown in FIGS. 7A through 9B.

Figure 7A:
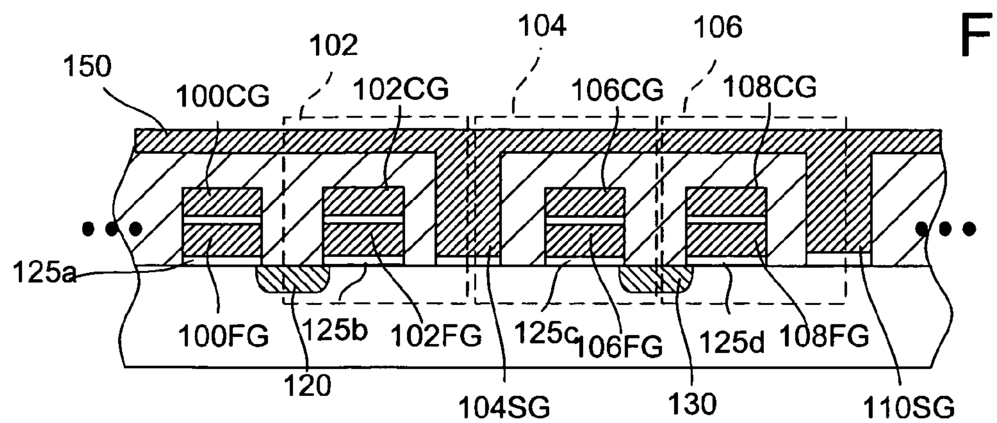
FIGS. 7A and 7B illustrate the first embodiment of a cell array which may utilize the method of the present invention.
Figure 7B:
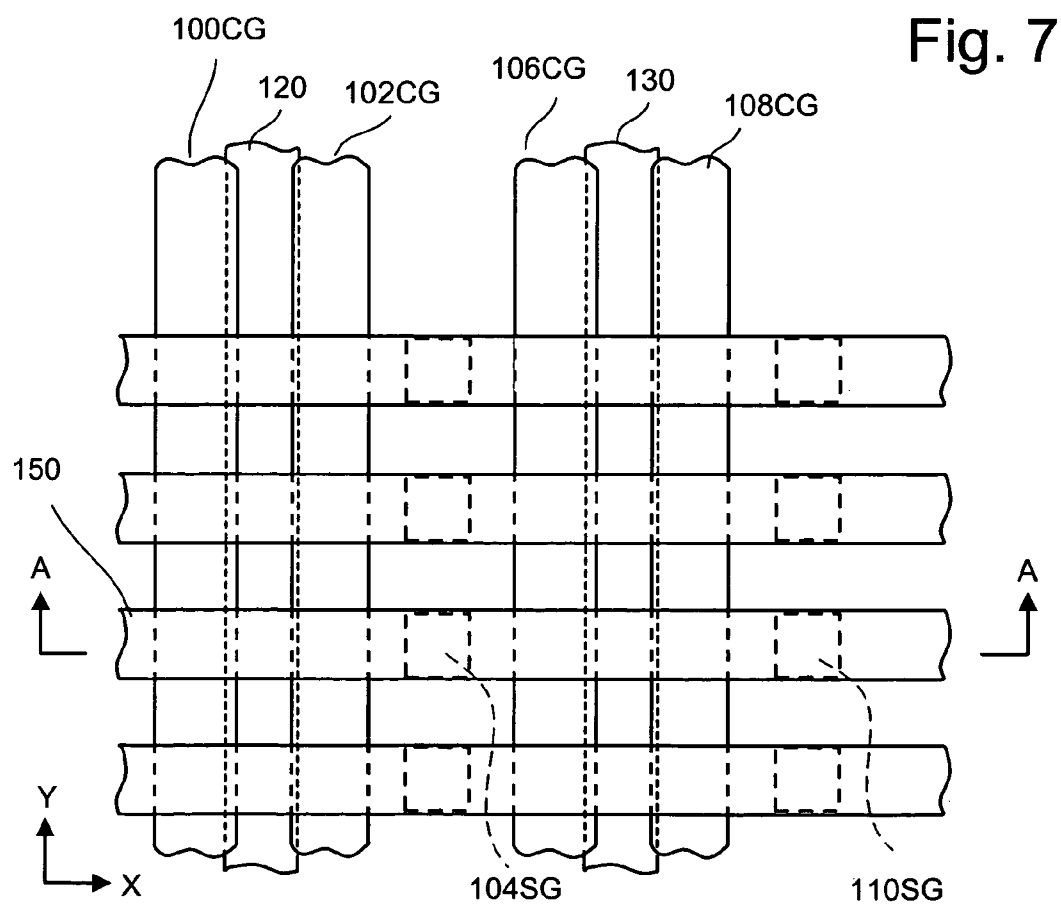

FIG. 7A is a cross-section of FIG. 7B. FIG. 7B is a plan view of the first exemplary cell array utilizing the programming technique of the present invention. Shown therein, a cell structure includes a number of transistors (also referred to as cells, memory cells, or storage elements) formed on a substrate or p-well region 140. Each memory element includes a stacked gate structure which consists of a control gate (100CG, 102CG, 106CG, 108CG) and a floating gate (100FG, 102FG, 106FG, and 108FG). Floating gates are formed on the surface of the p-well on top of a floating gate oxide film 125*a*–125*d*. N-type diffused layers 120 and 130 are shared between neighboring cells. These n-type diffused layers comprise source or drain regions for each of the cells. Note that, although FIG. 7A shows only three memory cells, the use of three cells is provided only as an example. Each cell also includes a select gate (104SG, 110SG). So, for example, memory cell 102 comprises control gate 102CG, floating gate 102FG, active region 120, and select gate 104SG. Memory cell 104 comprises select gate 104SG, control gate 106CG, floating gate 106FG and active region 130. Memory cell 106 comprises active region 130, control gate 108CG, floating 108FG, and select gate 110SG. Select gates 104SG and 110 SG of the memory cells 102, 104, and 106 may be formed into word line 150.

In operation, programming for cell 102 is controlled by a select gate 104SG, active region 120 and control gate 102CG. Likewise, programming control of cell 104 is provided by select gate 104SG, control gate 106CG and active region 130.

Figure 8A:
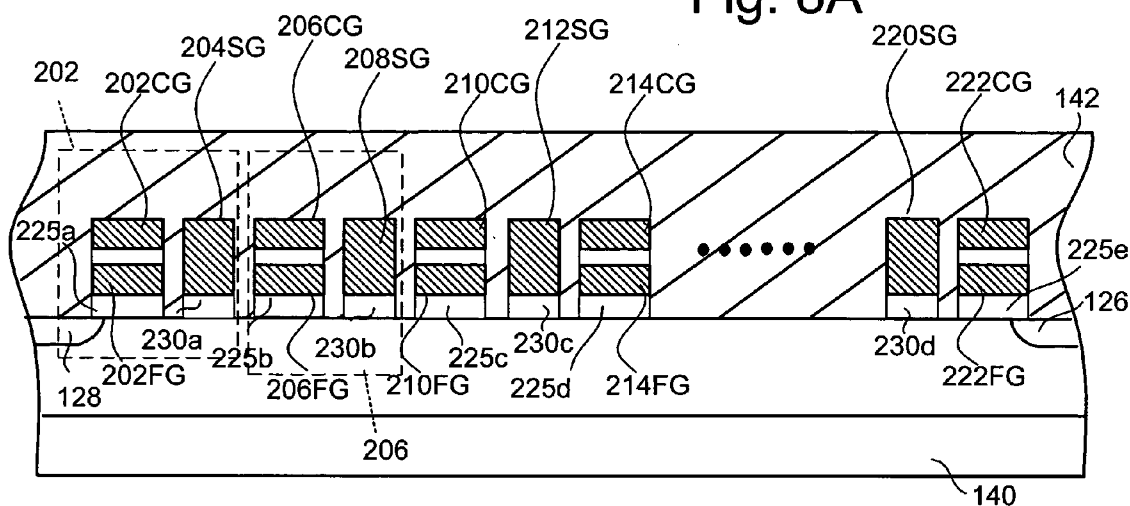
FIGS. 8A and 8B illustrate a second embodiment of a cell array which may utilize the method of the present invention.
Figure 8B:
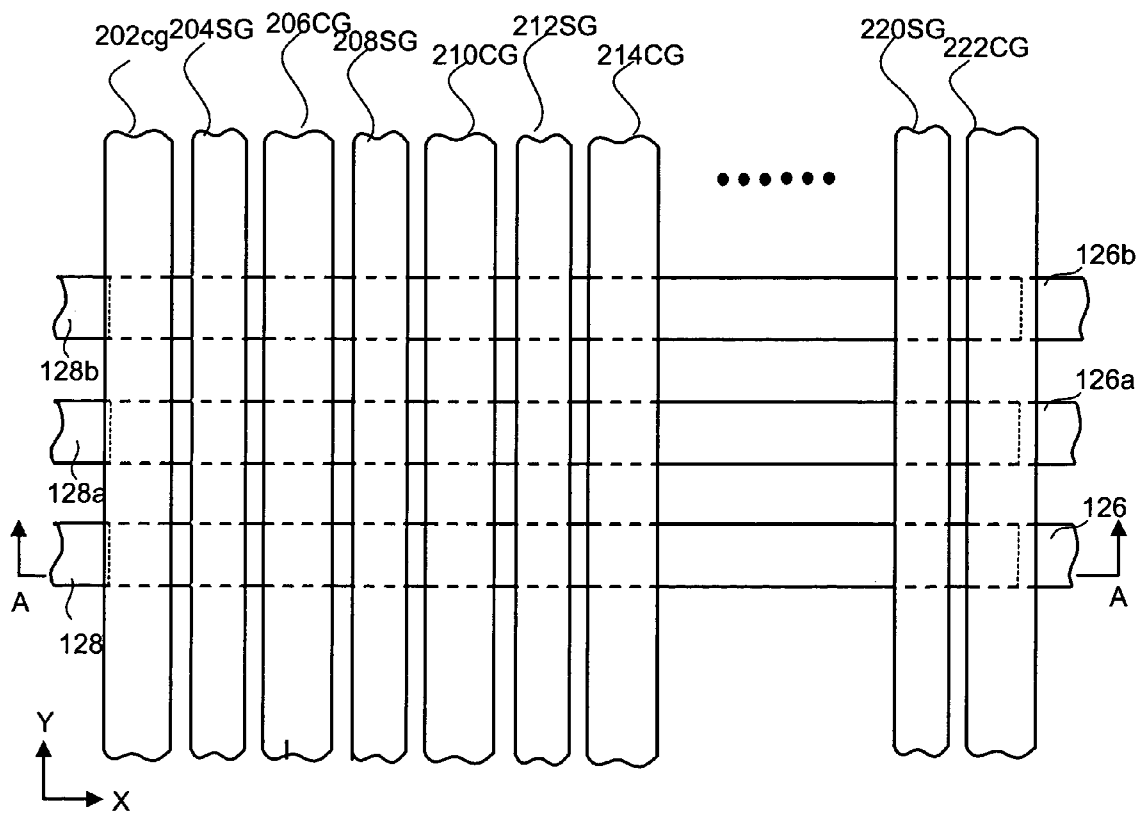

FIGS. 8A and 8B show an NAND string alternative for using the cell of the present invention. As shown therein, a group of NAND gates may comprise a number of floating gates, select gates and control gates. A cell structure includes a number of transistors (also referred to as cells, memory cells, or storage elements) formed on a substrate or p-well region 140. Each memory element includes a stacked gate structure which consists of a control gate (202CG, 206CG, 210CG, 214CG, and 222CG) and a floating gate (202FG, 206FG, 210FG, 214FG and 222FG). Floating gates are formed on the surface of the p-well on top of a floating gate oxide film 225*a*–225*e*. Select gates 204SG, 208SG, 212SG, and 220SG are formed on select gate oxide film 230*a*–230*d*. N-type diffused layers 128 and 126 are shared between the cells. Note that, although FIG. 8A shows only three memory cells, the use of three cells is provided only as an example. Although prior NAND structures use diffused regions to provide conductivity between the individual storage elements, this structure uses a bias applied to the select gate to create an inversion region and makes use of such diffused regions unnecessary.

To program a given cell, for example, cell 202, bias in accordance with the teachings herein may be applied to comprise control gate 202CG, floating gate 202FG, select gate 204SG, and active region 128. To program, for example, cell 206, bias in accordance with the teachings herein may be applied to comprise control gate 206CG, select gate 208SG, and active region 128. Control gate 202CG and select gate 204SG should be biased to create a channel region to electrically connect active region 128 to the inversion region formed under floating gate 206FG. To program cell 220, bias in accordance with the teachings herein may be applied to comprise control gate 222CG, select gate 220SG, and active region 126. Combinations of the active regions in 126 and 128 select gates, control gates and floating gates may thus be utilized to program each of the floating gates 202FG, 206FG, 210FG, and 214FG in accordance with the techniques described herein.

By way of example, a process suitable for fabricating a structure in accordance with the embodiment of FIG. 7 or 8 is generally described. It will be understood that any number of suitable processes may be utilized in creating memory structures suitable for use with the method of the present invention. In one example, a starting substrate is provided which is, for example, a P-type substrate or a P-type well region within an N-type substrate. Appropriate masking layers are formed and patterned in order to expose those areas in which N+ source and drain regions are to be formed. The N+ source and drain regions are then formed, for example, by ion implantation of arsenic to a concentration within a range specified herein. Alternatively, the source and drain regions are formed after one or more polycrystalline silicon layers are formed, in a conventional manner. Any masking layers are removed and a first layer of gate oxide overlying the channel regions formed by the floating gates and/or select gates is formed to a thickness as described. It should be understood that oxide formation may occur in different steps to reach different thicknesses, or through techniques such as differential oxide growth if oxides of differing thicknesses are required for different channels; in addition, masking steps may be used to ensure oxide growth is limited to the channel regions. A first layer of polycrystalline silicon is then formed on the wafer and patterned in order to form floating gate regions. Following the formation of the first polycrystalline silicon layer, a layer of oxide or oxide/nitride dielectric is formed over the remaining portions of polycrystalline silicon layer. A second layer of polycrystalline silicon for the control gates, and possibly the select gates, are then formed and doped to a desired conductivity. The second layer of polycrystalline silicon is then patterned into vertical strips (per the orientation of FIG. 7B or 8B). If the horizontal extent of the first polycrystalline silicon layer was not earlier defined, this pattern step is also used to remove the layer of dielectric between the first and second layers of polycrystalline silicon in those areas where the first layer of polycrystalline silicon is to be patterned simultaneously with the patterning of the second layer of polycrystalline silicon. In the FIG. 7 embodiment, following the first layer patterning, if not previously formed, an additional layer of dielectric may now be formed on the wafer to form the gate dielectric between the select gate and the silicon substrate to which the third layer of polycrystalline silicon is to make the select gate. The third layer of polycrystalline silicon is then formed and doped to appropriate conductivity. The third polycrystalline silicon layer is then patterned horizontally as shown in FIG. 7B.

Figure 9A:
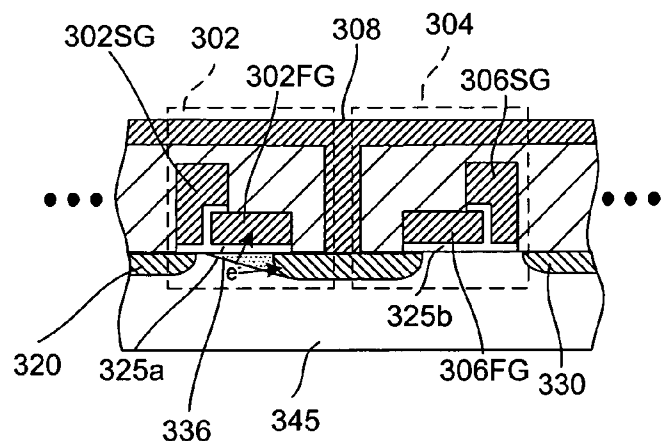
FIGS. 9A and 9B illustrate a third embodiment of a cell array which may utilize the method of the present invention.
Figure 9B:
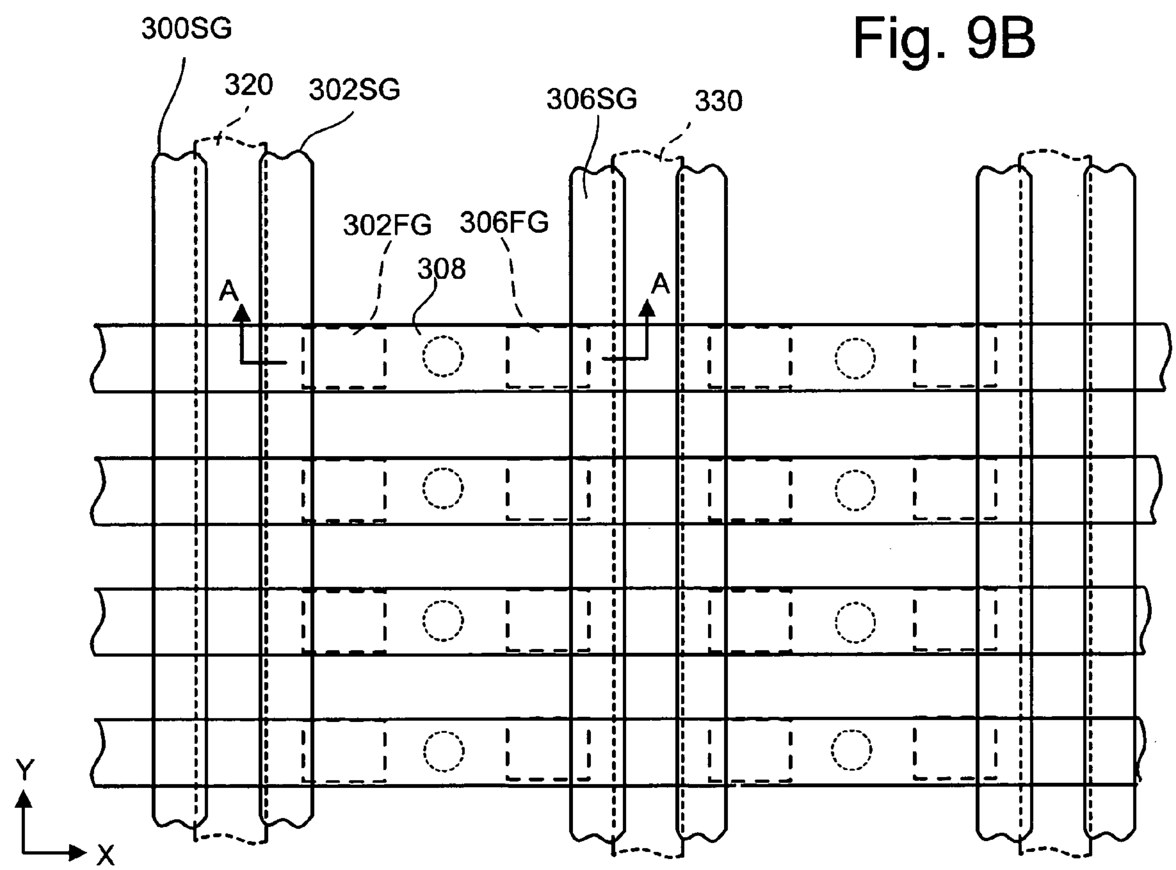

FIGS. 9A and 9B show yet another alternative embodiment of the present invention. In the embodiment of FIGS. 9A and 9B, no control gate is used for the cell, and operates by forming a depletion under the floating gate.

FIG. 9B is a plan view of the first exemplary cell array utilizing the alternative programming technique of the present invention. FIG. 9A is a cross-section of FIG. 9B. As shown therein, a cell structure includes a number of transistors formed on a substrate or p-well region 340. Each memory element 302, 304 includes a gate structure which consists of a floating gate (302FG, 306FG) and a select gate (302SG, 306SG). Floating gates are formed on the surface of the p-well on top of a floating gate oxide film 325*a*–325*b*. Unlike previous embodiments, no control gates are provided. A word line 308 is connected to an implanted source diffused region 345 which is shared between neighboring cells through a via or other suitable means. Diffused layers 320, 330 comprise source or drain regions for each of the cells. So, for example, memory cell 302 comprises select gate 302sG, floating gate 302FG, active region 320, and active region 345. Memory cell 304 comprises select gate 306SG, floating gate 306FG and active regions 330 and 345.

In operation, programming for cell 302 is controlled by select gate 302SG, and active region 345. Likewise, programming control of cell 304 is provided by select gate 306SG and active region 345. In this embodiment, the voltages applied to the cell 302 of FIG. 9A are selected to generate a depletion region under floating gate 302FG. IN one embodiment, the voltage applied to a select gate (302SG) is about 0 to −3 V and that applied to diffusion region 345 (source) is about 5–8 V.

Under these conditions, a depletion region 336 is formed under floating gate 302FG. Given the bias of the diffused region 345, the transistor operates in a manner similar to a pinched off transistor. The depletion region is formed by the critical electric field between select gate 302SG and diffusion region 345, causing electrons to flow toward diffusion region 345 and into floating gate 302FG.

Figure 10A:
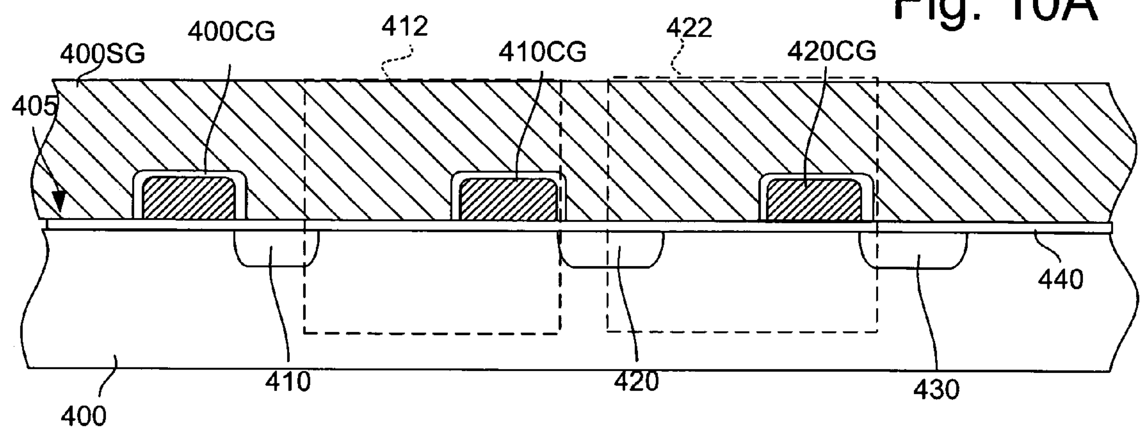
FIGS. 10A, 10B and 10C illustrate a fourth embodiment of a cell array which may utilize the method of the present invention.
Figure 10B:
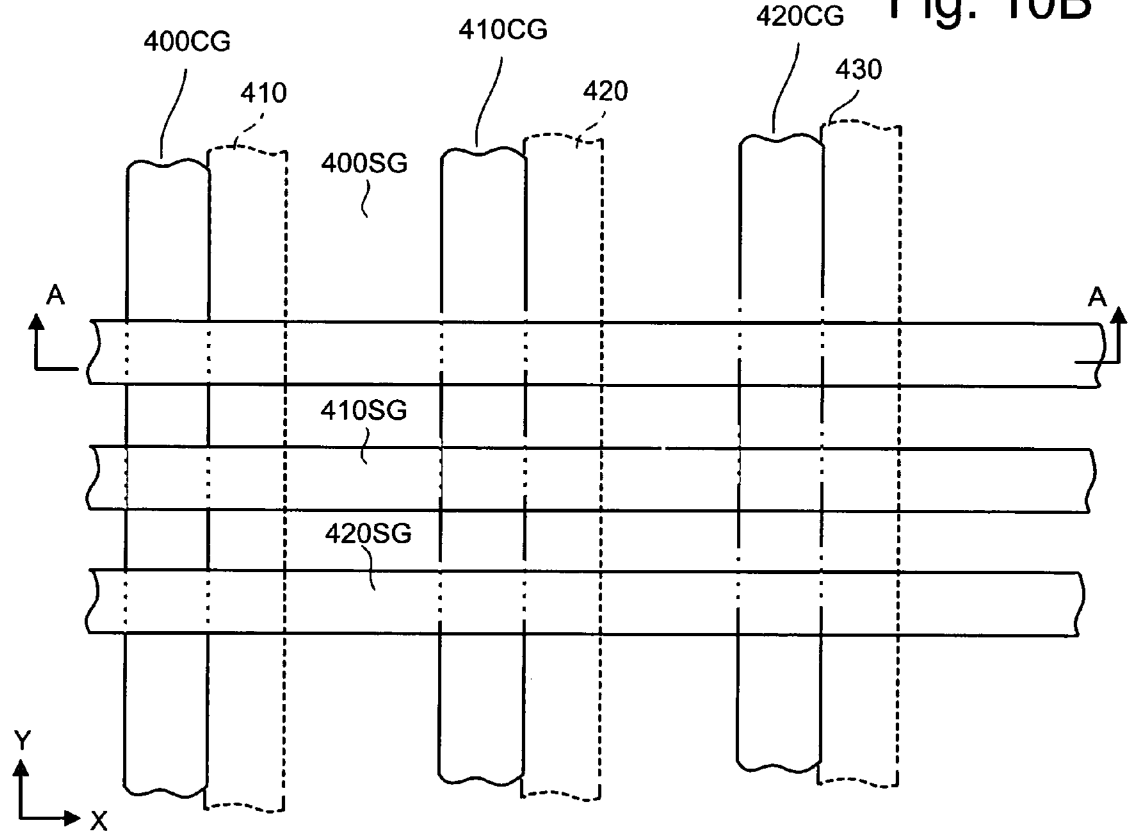
Figure 10C:
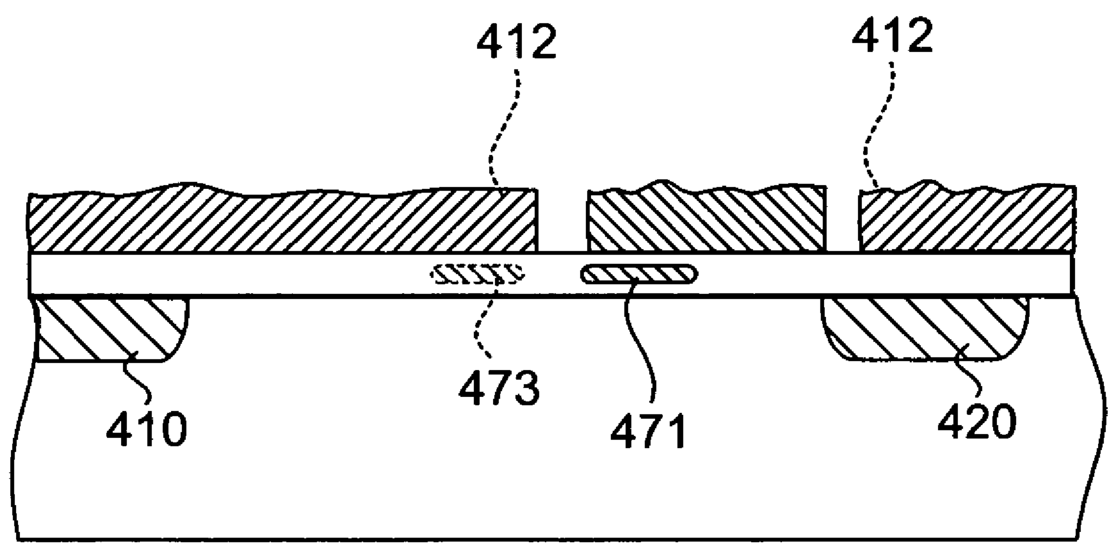

The programming techniques of the present invention may be used with yet another alternative cell embodiment. FIGS. 10A–10C show an embodiment of the invention utilized with a cell wherein charge is stored in at least one region of a charge trapping dielectric that is positioned between a conductive gate and the substrate. These memory cell examples may be operated either in a binary mode, where one bit of data is stored in each charge region, or in a multi-state mode, where more than one bit of data is stored in each region. Storage devices of this type are discussed in U.S. Patent Publication Document US2003/0080370 entitled "Multi-State Non-Volatile Integrated Circuit Memory Systems That Employ Dielectric Storage Elements," which is hereby fully incorporated herein by reference.

The methods of programming discussed with respect to FIGS. 1–9B above may be utilized to program the memory cells shown in FIGS. 10A–10C.

A few cells 412, 422 of a two-dimensional array of cells are illustrated in FIG. 10B in plan view. FIG. 10A is a cross section along line A–A' of FIG. 10B. Elongated, parallel source and drain diffusions 410, 420, 430 are provided below the surface 405 of a semi-conductor substrate (or well) 400, with their lengths extending in the y-direction and are spaced apart in the x-direction. A dielectric layer 440 including a charge storage material is formed on the substrate surface. Elongated, parallel conductive control gates 400CG, 410CG and 420CG are formed on the surface 405 of substrate 400, have lengths extending in the y-direction and are spaced apart in the x-direction. These gates can be made from doped polysilicon material, as is typical, and are positioned adjacent to diffusions 410, 420 and 430, respectively. Another set of select gates 400SG, 410SG and 420SG which form the word lines of the array are elongated in the x-direction and spaced apart in the y-direction.

FIG. 10C is an enlarged view of cell 412. The charge storage elements of this structure are the areas of the dielectric layer 440 between the source and drain diffusions 410, 420 and sandwiched between the control gates 410CG and the substrate 400. These storage element areas 471, 473 are marked with cross-hatching in FIG. 10C. The charge trapping material needs to be positioned only in these regions in order to form operable memory cells but may be extended over any other portions of the structure that is convenient, including over the entire memory cell array.

In one embodiment, a single region 471 of stored charge may be provided. The word line 400SG lies over the left approximately one-half of the channel length and the control gate 410CG over the other. The charge storing dielectric 440 is sandwiched between the substrate 400 and these gates. Application of programming voltages as specified with respect to the programming examples of FIGS. 1 and 9B to word line 400SG, diffusion region 420, and control gate 410CG will establish stored charge region 471. In other embodiments, the length of the individual memory cell channels may be divided into multiple portions that are field coupled with different ones of the diffusion regions 410, 420. In a divided channel embodiment, charge may be stored in two spatially separated regions 471 and 473 within the layer 440, and each of these regions may be individually programmed and read independently of the other. Programming by the methods of the present invention will generally causes the charge storage region 471 to be located adjacent an interior edge of the gate 400SG and the charge storage region 473 adjacent an interior edge of the gate 410CG.

The charge storing dielectric can be one of the two specific dielectrics and is made to be relatively thick in order to sustain the potential voltage differences between the two sets of gates, such as a 250 Angstroms thick oxide. One type is a layer of oxide-nitride-oxide, commonly known as "ONO." Electrons are trapped and stored in the nitride layer. The layer of conductive material from which the control gates are formed is then deposited on the ONO layer. The second structure uses a tailored layer 440 of silicon rich silicon dioxide to trap and store electrons. Such material is described in the following two articles, which articles are incorporated herein in their entirety by this reference: DiMaria et al., "Electrically-alterable read-only-memory using Si-rich SIO.sub.2 injectors and a floating polycrystalline silicon storage layer," J. Appl. Phys. 52(7), July 1981, pp. 4825–4842; Hori et al., "A MOSFET with Si-implanted Gate-Si0.sub.2 Insulator for Nonvolatile Memory Applications," IEDM 92, April 1992, pp. 469–472.

It should be recognized that while the invention has been described with respect to providing electrons onto each of the floating gates, hole injection may be accomplished using the same techniques. While the inventions have been described with respect to a p-substrate or a p-well device, it should be recognized that the substrate may be an n-well device or an n-substrate in conjunction with a p-type active region.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for programming a storage element, the element including at least a first gate on a substrate, an active region in the substrate, and a second gate adjacent to the first gate, comprising:

creating an inversion region in the substrate below the first gate by biasing the first gate; and creating a critical electric field adjacent to the second gate sufficient to create electron-hole pairs at a junction with the inversion region.

2. The method of claim 1 wherein the step of creating a critical electric field comprises:

applying a first positive bias to the active region; and applying a bias less than the first positive bias to the second gate.

3. The method of claim 2 wherein the step of applying a bias less than the first positive bias includes applying a bias equal to or less than 0 volts.

4. The method of claim 2 wherein the step of applying a bias less than the first positive bias includes applying a bias in a range of 0 volts to −3 volts.

5. The method of claim 2 wherein the step of applying a first positive bias includes applying a bias greater than 3 volts.

6. The method of claim 2 wherein the step of creating an inversion region includes applying a second positive voltage greater than the first positive voltage to the first gate.

7. The method of claim 6 wherein the second positive voltage is greater than 8 volts.

8. The method of claim 1 wherein the substrate is a p-type substrate and the active region is an n-type impurity region.

9. The method of claim 8 wherein the p-type substrate has an impurity concentration in a range of about $10^{16}$–$10^{18}$ atm/cm3.

10. The method of claim 1 wherein the substrate is an n-type substrate and the active region is a p-type impurity region.

11. The method of claim 10 wherein the active region has a doping concentration of about $10^{17}$–$10^{20}$ atm/cm$^3$.

12. The method of claim 1 wherein the first gate is positioned on the substrate on a first gate insulator and the second gate is positioned on a second gate insulator on the substrate.

13. The method of claim 12 wherein the first gate insulator has a thickness in the range of about 60–100 Å.

14. The method of claim 13 wherein the second gate insulator has a thickness in the range of about 20–200 Å.

15. The method of claim 1 wherein the storage element further includes a control gate positioned at least partially over the first gate and separated from the first gate by a third insulator layer.

16. The method of claim 15 wherein said step of creating an inversion layer includes biasing the control gate.

17. The method of claim 1 wherein the storage element further includes a charge storing dielectric, and the method includes creating the critical electric field under at least one portion of the charge storing dielectric.

18. A method for programming a storage element, comprising:

providing a storage element including at least a control gate on a substrate, an active region in the substrate, and a select gate adjacent to the control gate;

biasing the control gate to create an inversion region under the control gate; and applying a first bias to the active region and a second bias to the select gate to create a critical electric field sufficient to create electron-hole pairs at a reverse biased junction with the inversion region relative to the active region in the substrate under the control gate.

19. The method of claim 18 wherein the step of providing includes providing a multistate-storage element.

20. The method of claim 18 wherein the step of providing includes providing an EEPROM storage element.

21. The method of claim 18 wherein the step of providing includes providing a FLASH EEPROM storage element.

22. The method of claim 21 wherein the EEPROM storage element is a NAND element.

23. The method of claim 21 wherein the storage element is a NOR storage element.

24. The method of claim 18 wherein said applying and biasing steps complete storage of digital information.

25. The method of claim 18 wherein said applying and biasing steps complete storage of analog information.

26. The method of claim 18 wherein the step of biasing the floating gate includes applying a bias greater than 8 volts.

27. The method of claim 18 wherein the second bias is equal to or less than 0 volts.

28. The method of claim 18 wherein the first bias is greater than 3 volts.

29. A storage element comprising:

an active region having a first impurity type in a substrate having substantially a second impurity type;

a control gate on the substrate;

a select gate positioned adjacent to the control gate on the substrate;

a first bias greater than zero volts applied to the active region and a second bias greater than the first bias applied to the control gate, and a third bias less than or equal to zero applied to the select gate, said first and third bias selected to create leakage current in the substrate between the control gate and the select gate.

30. The element of claim 29 wherein the first positive bias is greater than 3 volts.

31. The element of claim 29 wherein the second bias is greater than 8 volts.

32. The element of claim 29 wherein the substrate is a p-type substrate and the active region is an n-type impurity region.

33. The element of claim 32 wherein the p-type substrate has an impurity concentration in a range of about $10^{16}$–$10^{18}$ atm/$cm^3$.

34. The element of claim 33 wherein the active region has a doping concentration of about $10^{17}$–$10^{20}$ atm/$cm^3$.

35. The element of claim 29 wherein the substrate is an n-type substrate and the active region is a p-type impurity region.

36. The element of claim 29 wherein the control gate is positioned on the substrate on a floating gate oxide and the select gate is positioned on a select gate oxide on the substrate.

37. The element of claim 36 wherein the floating gate oxide has a thickness in the range of about 60–100 Å.

38. The element of claim 36 wherein the select gate oxide has a thickness in the range of about 20–200 Å.

39. The element of claim 29 wherein the storage element is a NAND cell.

40. The element of claim 29 wherein the storage element is a NOR cell.

41. A method of programming at least a storage element provided on a substrate, said element including at least a control gate, a select gate positioned laterally adjacent to the control gate, and an active region, comprising:

applying a first positive bias to the active region;

applying a second bias less than or equal to zero to the select gate; and applying a third bias greater than the first bias to the control gate.

42. The method of claim 41 wherein the step of applying a second bias includes applying a bias in a range of 0 to −3 volts.

43. The method of claim 41 wherein the step of applying a first positive bias includes applying a bias in a range of about 3–7.5 volts.

44. The method of claim 43 wherein the step of applying a third bias includes applying a bias equal to or greater than 8–15 volts.

45. An apparatus, comprising:

a storage element, the element including at least a first gate on a substrate, an active region in the substrate, and a second gate adjacent to the first gate;

means for creating an inversion region in the substrate below the first gate by biasing the first gate; and means for creating a critical electric field to create electron-hole pairs adjacent to the second gate.

46. The apparatus of claim 45 wherein the means for creating a critical electric field comprises means for applying a positive bias to the active region and means for applying a bias less than or equal to zero to the second gate.

47. The apparatus of claim 45 wherein the means for creating an inversion region comprises means for applying a second positive bias greater than the first positive bias to the first gate.

48. A storage element comprising:

an active region having a first impurity type in a substrate having substantially a second impurity type;

a charge storing dielectric;

a select gate positioned adjacent to the control gate on the substrate;

a first bias greater than zero volts applied to the active region and a second bias greater than the first bias applied to the control gate, and a third bias less than or equal to zero applied to the select gate, said first and third bias selected to create leakage current in the substrate between the control gate and the select gate.

49. The element of claim 48 wherein the first positive bias is greater than 3 volts.

50. The element of claim 48 wherein the second bias is greater than 8 volts.

51. The element of claim 48 wherein the dielectric is a layer of oxide-nitride oxide.

52. The element of claim 48 wherein the dielectric is a layer of silicon rich silicon dioxide.

53. The element of claim 48 wherein the dielectric includes a first and a second charge trapping regions.

54. The element of claim 48 wherein the dielectric has a thickness of about 250 Angstroms.

55. A method for programming a storage element, the element including at least a first gate on a substrate, a first active region and a second gate, and a charge storage region, the method comprising the steps of:

creating a depletion region under the first gate;

biasing the first active region and the second gate with a respective first and second voltage sufficient to create a critical electric field sufficient to create electron-hole pairs at a junction with the depletion region; and biasing the first gate with a third voltage sufficient to attract a portion of the electrons to the charge storage region.

56. The method of claim 55 wherein the charge storage region is a dielectric.

57. The method of claim 55 wherein the charge storage region is the first gate on the substrate.

58. The method of claim 55 wherein the step of biasing the second gate includes applying a bias equal to or less than 0 volts.

59. The method of claim 58 wherein the step of biasing the second gate include applying a bias of 0 to −3 volts.

60. The method of claim 55 wherein the step of biasing the first active region include applying a bias in a range of 5–8 volts.

* * * * *